GATE PULSE GENERATOR

Filed Jan. 3, 1966

WITNESSES:
Bernard R. Gieguay
James F. Young

INVENTORS
Robert E. Hull and
Loren F. Stringer.
BY A. Samuel Oddi
ATTORNEY

United States Patent Office 3,440,447
Patented Apr. 22, 1969

3,440,447

GATE PULSE GENERATOR

Robert E. Hull, Amherst, and Loren F. Stringer, Clarence, N.Y., assignors to Westinghouse Electric Corporation, Pittsburgh, Pa., a corporation of Pennsylvania Filed Jan. 3, 1966, Ser. No. 518,325
Int. Cl. H03k *5/153*
U.S. Cl. 307—261 6 Claims

ABSTRACT OF THE DISCLOSURE

Gate pulse generating circuits are disclosed wherein gating pulses having predetermined characteristics are generated in response with alternating input signals after a predetermined time delay as determined by a control signal input. With polyphase alternating input signals being utilized, gating pulses are developed at predetermined timed intervals.

The present invention relates to pulse generator circuitry and more particularly to pulse generator circuits for applying gating pulses to controlled switching devices.

Gating pulses which have predetermined characteristics must be supplied to the power control rectifiers of an AC to DC converter circuit to insure proper operation of the circuit. In application Ser. No. 514,462, filed Dec. 17, 1965, now U.S. Patent No. 3,371,261, issued Feb. 27, 1968, by R. E. Hull and E. T. Schonholzer, assigned to the same assignee as the present application, gate pulse amplifier circuitry is disclosed which provides pulses of the desired characteristic for controlling the high power controlled rectifier devices of the converter circuit. The gating pulses to be supplied to the high power controlled rectifiers are initiated by the gate pulse amplifier circuit, which also includes a controlled switching device, but with the device being of a much lower power capacity. The controlled switching device of the gate pulse amplifier must be supplied with gating pulses in order for the gate pulse amplifier to generate the pulses of the desired characteristics. A gate pulse generator must thus be supplied which is capable of supplying pulses to the controlled switching device of the gate pulse amplifier circuitry. The gate pulse generator circuit must, moreover, supply pulses of predetermined characteristics in order to insure the switching at the proper time of the controlled switching device of the gate pulse amplifier. Furthermore, the pulses supplied by the gate pulse generator must be accurately spaced in time, for example, at 60° intervals of the alternating current frequency.

It is also necessary that the timing of the pulses supplied by the gate pulse generator circuitry be controlled with respect to the beginning of the alternating current wave form. That is, it is necessary for a gate pulse from the gate pulse generator to be supplied after a predetermined time delay $\alpha$ with respect to the beginning of alternating current cycle utilized to control the generation of these pulses. It is advantageous to provide control of the time delay of the pulses generated through the use of a control voltage which permits the control of the delay angle $\alpha$ between substantially 0° delay and 180° delay. Also, it is highly desirable that the pulses generated by the gate pulse generator have a relatively rapid rise time to approximately 70% of their maximum amplitude within one microsecond, while having a limited time duration so as to avoid excessive dissipation of power in the controlled switching devices of the circuitry.

It is therefore an object of the present invention to provide new and improved gate pulse generator circuitry.

It is a further object of the present invention to provide new and improved gate pulse generator circuitry for generating pulses having a predetermined time spacing therebetween.

It is a further object to provide new and improved gate pulse generator circuitry wherein the time delay at which a gating pulse is generated with respect to an alternating waveform may be controlled.

It is a further object of the present invention to provide new and improved gate pulse generator circuitry to generate pulses having predetermined characteristics to be supplied to controlled switching devices.

Broadly, the present invention provides new and improves gate pulse generating circuits in which gating pulses having predetermined characteristics are generated in response to alternating input signals after a predetermined time delay as established by a control signal. With polyphase alternating input signals being utilized, gating pulses are developed at predetermined time intervals to be used as gating signals for controlled switching devices.

These and other objects and advantages of the present invention will become more apparent when considered in view of the following specification and drawings, in which.

Figure 1:
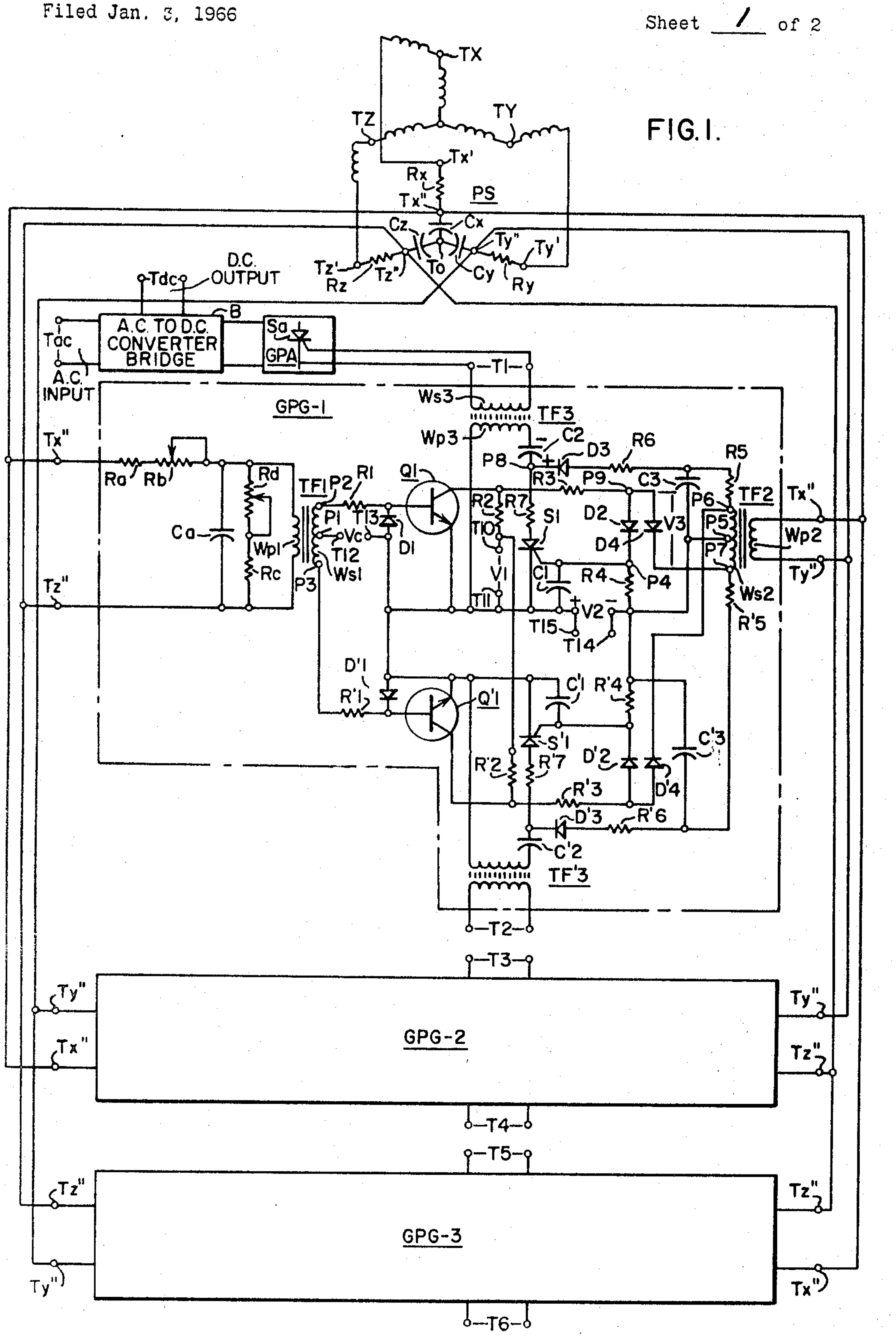
FIG. 1 is a schematic block diagram of the pulse generator circuitry of the present invention.

Referring to FIGURE 1, three gate pulse generators designated GPG–1, GPG–2 and GPG–3 are illustrated. The gate pulse generator GPG–1 is shown schematically, while GPG–2 and GPG–3 are shown as block diagrams, but are identical in their circuit construction to that of GPG–1. The respective phases X–Y, Y–Z, Z–X of a three phase alternating input voltages are applied as shown in FIG. 1 to the various input terminals $Tx''$–$Tz''$ and $Tx''$–$Ty''$ of GPG–1; $Ty''$–$Tx''$ and $Ty''$–$Tz''$ of GPG–2, and $Tz''$–$Ty''$ and $Tz''$–$Tx''$ of GPG–3.

The three-phase input voltage is developed at the terminals TX, TY and TZ of the secondary winding of a three-phase input transformer as shown schematically in FIG. 1. The secondary winding has a zig-zag connection to develop a 16° lead of voltages developed at the respective terminals $Tx'$, $Ty'$ and $Tz'$. The voltages developed at these terminals are applied to a respective terminal of a phase shift circuit PS which includes resistive and capacitive elements to give a 16° lag. The phase shift circuit PS includes a resistor $Rx$ and a capacitor $Cx$ connected between the terminal $Tx'$ and a common terminal $To$; a resistor $Ry$ and a capacitor $Cy$ connected between the terminal $Ty'$ and the common terminal $To$; and a resistor $Rz$ and a capacitor $Cz$ connected between the terminal $Tz'$ and the common terminal $To$. The capacitors and resistors are selected to develop the 16° lag. The use of the phase shift connection and circuit provides much needed filtering of the input AC supply voltage which is utilized in the gate pulse generator circuits. The terminals $Tx''$, $Ty''$ and $Tz''$ are connected between the respective resistor-capacitor pairs and are connected to the corresponding terminals of the gate pulse generators GPG–1, GPG–2 and GPG–3. As shown for the gate pulse generator GPG–1, a 30° phase shift circuit including a resistor $Ra$ and a resistor $Rb$ is connected in series between the terminal T$x''$ and a primary winding W$p$1 of a transformer TF1. A parallel combination of a capacitor C$a$ and a resistor R$c$ and a resistor R$d$ are connected directly across the primary winding W$p$1. The resistors R$b$ and R$d$ may be made adjustable to provide the proper adjustment of the circuit. A two-stage cascade filter is thus provided to the transformer TF1 by means of the 16° and 30° phase shifts provided. It should also be noted that similar phase shift circuits would be included in the gate pulse generators GPG–2 and GPG–3.

In reference to GPG–1, the input terminals T$x''$, T$y''$ and T$z''$ are so connected to the three-phase, phase shift circuit as to obtain a 60° phase shift between the respective input terminals of the gate pulse generators GPG–1, GPG–2 and GPG–3. Together with the 30° phase shift developed between the input terminals T$x''$ and T$z''$ and the primary winding W$p$1 of the transformer TF1, a 90° delay results between this winding and the terminals T$x''$ and T$y''$, which is the necessary condition to establish a cosine relationship therebetween which is desired as will be further explained below. It should be noted that a similar phase relationship will exist in the gate pulse generators GPG–2 and GPG–3.

The gating pulses developed in the gate pulse generators are provided at the output terminal pairs T1 and T2 of GPG–1; the output terminal pairs T3 and T4 of GPG–2; and the output terminal pairs T5 and T6 of the GPG–3. The output waveform appearing across the terminals T1 through T6 are applied, for example, to a gate pulse amplifier such as described in U.S. Patent 3,371,261, cited above. As shown schematically in FIG. 1, the output at the terminal T1 is applied to the gate electrode of a controlled rectifier S$a$ of a gate pulse amplifier GPA. The output of gate pulse amplifier GPA is applied to an AC to DC converter bridge B which will include high power controlled rectifiers arranged in a bridge array, with the pulse output of gate pulse amplifier controlling these rectifiers. The bridge B has an AC input of a predetermined frequency applied across a pair of terminals T$ac$ and provides a DC output at a pair of terminals T$dc$. For purposes of clarity only the connection for the terminals T1 of the gate pulse generator GPG-1 and the gate pulse amplifier GPA and converter bridge B are shown; however, the other outputs would be similarly connected. Reference is made to the above cited patent which shows the circuitry and interconnections which could be utilized in the gate pulse amplifier and bridge converter as shown in block form herein.

Each of the gate pulse generators includes a model circuit and a mirror image circuit thereof. The circuits are identical and symmetrical, with the mirror image circuit of the model circuit being shown in the lower half of the schematic diagram and the prime (′) designation indicating the corresponding component to the unprimed component appearing in the upper portion of the circuit. For purposes of explanation, principal attention will be given to the model circuit shown in the upper portion of the schematic diagram of FIG. 1.

The gate pulse generator GPG–1 includes a controlled switching device S1 which may comprise a silicon controlled rectifier (SCR). As is well known in the art, a controlled rectifier is a semiconductor device which includes anode, cathode and gate electrodes, and which may be rendered conductive unidirectionally from anode to cathode by the application of a gating voltage to the gate electrode thereof which is positive with respect to the cathode electrode. At the time of the application of such a gating voltage, if the anode is positive with respect to the cathode electrode thereof, the device will be gated on and will pass current from anode to cathode.

The delay angle $\alpha$ represents the number of degrees of the input alternating waveform from the beginning of a cycle thereof that it will take before a controlled rectifier will be rendered conductive by the application of a gating signal to the gate electrode thereof.

Figure 2:
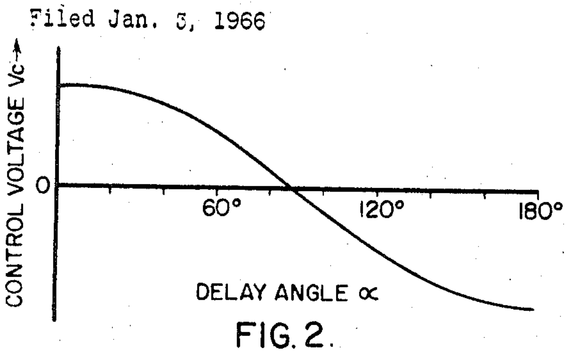
FIG. 2 is a plot control voltage $Vc$ versus delay angle $\alpha$.

In the present circuit the gate delay angle $\alpha$ of the controlled rectifier devices used may be controlled by a gate control voltage V$c$. It is desirable that the control voltage V$c$ and the delay angle $\alpha$ be related by a cosine function. The desired relationship as utilized in the present circuitry as shown in FIG. 2 wherein V$c$ is shown to be a function of the cosine of the delay angle $\alpha$. As can be seen at FIG. 2, for a maximum of value of control voltage V$c$ the delay angle is 0°, while at a 90° delay angle the control voltage is zero volts. For the negative maximum control voltage, the delay angle is 180°. Note, also that the voltage V$c$ is measured with respect to the center tap of transformer TF1 so that a positive V$c$, as shown in FIG. 2, causes $\alpha$ to phase toward 0 and a negative V$c$ causes $\alpha$ to phase toward 180°.

The reason for the desirability of the control voltage V$c$ and delay angle $\alpha$ being related by the cosine function is that the output voltage of the AC to DC converter bridge is also related by cosine function to the delay angle. Thus, control voltage and the output voltage will be linearly related if the control voltage V$c$ and the delay angle are related by a cosine function.

With reference to FIG. 1, the manner in which the delay angle $\alpha$ is controlled will now be explained. The input alternating voltage supplied to the terminals T$x''$ and T$z''$ is applied to a primary winding W$p$1 of an input transformer TF1. The transformer TF1 has a secondary winding W$s$1 which is center tapped, the center tapped point being indicated by circuit point P1. The top of the secondary winding W$s$1, at a circuit point P2, is connected to a resistor R1. The other end of the resistor R1 is connected to the base of a transistor Q1. The bottom end of the winding W$s$1 is connected at a circuit point P3 to a resistor R′1 which has its other end connected to the base of a transistor Q′1. The components R′1 and Q′1 are part of the mirror image circuit of the model circuit. The transistor Q1 has its collector electrode connected through a resistor R2 to a terminal T10. Between the terminal T10 and a terminal T11, connected at the emitter of the transistor Q1, is applied a unidirectional voltage V1 of positive polarity at the terminal T10, as indicated, to act as a power supply for the transistor Q1. A diode D1 is conected between the base and emitter electrodes of the transistor Q1, with the cathode of the diode D1 being connected at the base electrode and the anode at the emitter electrode thereof. Between the center tap junction point P1 of the transformer TF1 and the emitter of the transistor Q1 is applied, the control voltage V$c$ across a pair of terminals T12 and T13. Also connected to the collector of the transistor Q1 is a resistor R3 which has its other end connected to the anode of a diode D2. The cathode of the diode D2 is connected at a circuit point P4 to a resistor R4, which has its other end connected at a terminal T14. The junction point P4 is connected to the gate electrode of the controlled rectifier S1. The cathode of the controlled rectifier S1 is commonly connected with the terminal T11 and a terminal T15. Between the terminals T14 and T15 is applied a unidirectional voltage V2 of the polarity as indicated, with terminal T15 being positive with respect to T14. A capacitor C1 is connected between the gate and cathode electrodes of the controlled switch S1 and acts as a bypass capacitor to noise. The unidirectional voltages V1 and V2 may be provided any suitable sources of operating potentials well known within the art.

Figure 3:
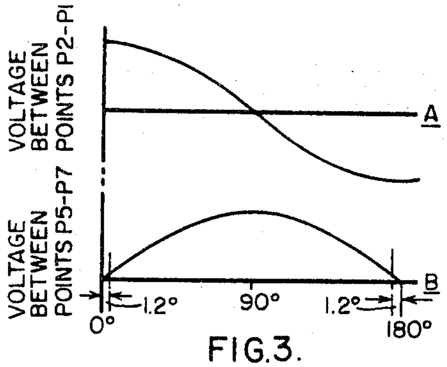
FIG. 3 is a wave form diagram including curves A and B which are used in the explanation of the operation of the circuitry of FIG. 1.

The alternating waveform which is applied between the circuit points P2 and P1 of input transformer TF1 is illustrated in a Curve A of FIG. 3, and is shown as a cosine function. The transistor Q1 will be conductive between its collector and emitter electrodes when its base electrode is more positive than its emitter electrode by approximately 0.6 volt as a typical example of a silicon transistor. The base-emitter circuit of the transistor Q1 is supplied by two voltage sources, namely: (1) the alternating voltage appearing across the circuit points P2 and P1 of the secondary winding $Ws1$, and (2) the unidirectional control voltage $Vc$ between the terminals T12 and T13. When the transistor Q1 is fully conductive, the collector electrode thereof is approximately 0.2 volt positive with respect to the emitter electrode. Under these conditions, the gate electrode of the controlled rectifier S1 is negative with respect to its cathode electrode because of the bias voltage V2 of about 0.75 volt and therefore will be in its non-conductive, high impedance state between its anode and cathode electrodes. When, the transistor Q1 becomes non-conductive, with its collector being driven positive, a positive polarity signal will be applied at the gate of the controlled switch S1 and hence will gate on the controlled rectifier S1 to begin a pulse generating cycle. This will be discussed in more detail below.

The conduction of the transistor Q1 can be controlled by the magnitude of the control voltage $Vc$, which is a unidirectional voltage of positive or negative polarity applied between the base and the emitter of the transistor Q1. By the adjustment of this voltage, the period of conduction of the transistor Q1 can be established, with the cosine voltage applied between the circuit points P2 and P1 driving the base of the transistor Q1 positive with respect to its emitter electrode whenever the DC biasing level of the control voltage $Vc$ will so permit. The control voltage $Vc$ thus controlling the conductive and non-conductive periods for the transistor Q1, the time delay $\alpha$, before the controlled switching device S1 is gated on witha respect to the cosine waveform across the terminals P2, P1, is also controlled by the control voltage $Vc$. The circuit design is such that the delay angle $\alpha$ and the control voltage $Vc$ are related by a cosin function as is shown in FIG. 2. Thus, by the selection of the control voltage $Vc$, the delay angle $\alpha$ may also be selected. For example, if a 90° angle is desired the control voltage $Vc$ would be set at zero volts, see FIG. 2.

Since the voltage appearing between the points P3 and P1 of the input transformer TF1 is a 180° out of phase to the voltage appearing between the points P2 and P1, the operation of the mirror image circuit including the transistor Q'1 and the controlled rectifier S'1 will be 180° out of phase with respect to the operation of transistor Q1 and the controlled rectifier S1 of the model circuit. Therefore, pulses initiated by the non-conduction of the transistor Q'1 to gate on the controlled rectifier S'1 will be 180° out of phase with the pulses generated by the model circuit.

The gating pulses which appear across the terminals T1 through T6 are generated in the following manner. An AC voltage is supplied across the terminals $Tx''$ and $Ty''$, which is the X–Y phase of a three phase input voltage. The terminals $Tx''$ and $Ty''$ are connected across the primary winding $Wp2$ of a transformer TF2. The transformer TF2 has a secondary winding $Ws2$ which has a center tapped secondary, the center tap being at a circuit point P5. The secondary winding $Ws2$ has at its ends junction points P6 and P7. The point P6 is connected to a resistor R5 which has its other end connected to a resitsor R6. The other end of the resistor R6 is connected to the anode of a diode D3. The cathode of the diode D3 is connected to a junction point P8. A resistor R7 is connected between the junction point P8 and the anode of the controlled rectifier S1. A capacitor C2 has one end connected to the junction point P8 and the other end connected to one end of a primary winding $Wp3$ of a pulse transformer TF3. The other end of the primary winding $Wp3$ is retured to a point common to the emitter of the transistor Q1. Across the secondary winding $Ws3$ of the transformer TF3 is connected the output terminals T1 where the gating pulses generated in the pulse generator circuit are provided. A capacitor C3 is connected between junction point between the resistors R5 and R6 and the center tap point P5 of the transformer TF2.

The capacitor C2 charges through the resistors R5 and R6 and the diode D3 during the half cycle that the junction point P6 is positive. The capacitor C2 will charge to the polarity as shown to the maximum value of the impressed voltage. During this interval, the controlled switch S1 is maintained in its non-conductive state through gate control by an inhibitor circuit to be described below. The diode D3 being so poled prevents the capacitor C2 from discharging; therefore, the charge voltage across the capacitor C2 appears across the anode to cathode circuit of the controlled rectifier S1. When the gate electrode of the controlled rectifier S1 is driven positive with respect to its cathode, the controlled rectifier S1 is gated on with the voltage across the anode and cathode thereof dropping very rapidly. The voltage appearing across the capacitor C2 is thereby impressed across the primary winding $Wp3$ of the pulse transformer TF3. The capacitor C2 is then discharged through the resistor R7, the anode-cathode circuit of the controlled switch S1 and the primary winding $Wp3$ of the pulse transformer TF3. This discharge time constant is designed to be at least 260 microseconds.

The pulse transformer TF3 is designed to be of the saturable type and is designed to saturate after approximately 20 microseconds. At the time of saturation the capacitor C2 quickly discharges to substantially zero voltage to terminate the pulse generation.

Figure 4:
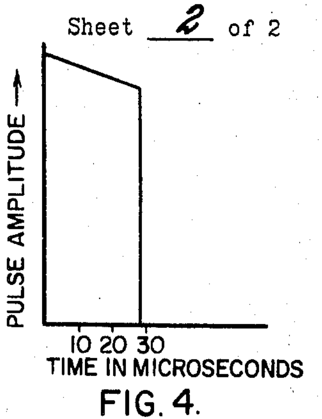
FIG. 4 is a waveform diagram of the gate pulse generated in the circuitry of FIG. 1.

A typical gate pulse waveform is shown in FIG. 4. As can be seen from the figure, with the controlled rectifier S1 being gated on at a time 0, the pulse amplitude rapidly rises to within 70% of its maximum amplitude within approximately one microsecond. The pulse has a substantially square waveform because the time required to saturate the transformer TF3 is small compared to the time constant of the discharge circuit. The pulse duration is slightly longer than 20 microseconds and is terminated relatively quickly after the 20 microseconds saturation period of the transformer TF3 has been reached. The waveform as shown in FIG. 4 appears across the pair of terminals T1 through T6. The time at which pulses appear at terminals T1 and T2; T2 and T4; and T5 and T6 are respectively 180° out of phase with each other.

A reverse polarity voltage is applied across the primary winding $Wp3$ of the pulse transformer TF3 during the charging half cycle of the capacitor C2 which insures that the pulse transformer resets to its original state. The reverse voltage buildup across the primary winding $Wp3$ is relatively slow and the reverse voltage appearing across the secondary winding is relatively low. However, when the transformer suddenly saturates in the reverse direction, a voltage overshoot may occur because of the series path through the capacitors C2 and C3 and the inductance of the pulse transformer TF3. The direction of this overshoot is such that it could cause gating on of a controlled rectifier connected across the output terminals T1. The resistor R6 is inserted in series with these elements in order to provide critical damping and to avoid the possibility of an overshoot and the undesired gating on of a controlled rectifier.

As an example of a typical circuit operation, the controlled rectifier S1 will be gated on if a positive voltage of approximately 0.8 volt with respect to its cathode electrode is applied to the gate electrode thereof. The magnitude of positive voltage applied to the gate electrode may be controlled by the voltage appearing at the point P9, which is coupled to the collector of the transistor Q1 through the resistor R3. Therefore, allowing a forward drop for diode D2 of 0.7 volt and a voltage of 0.75 volt for the voltage V2 between terminals T15 and T14, the point P9 must be positive with respect to point P5 of transformer TF2 by approximately 2.25 volts for gating to occur. The voltage V2 may be established as the forward drop of a diode. The voltage appearing at the point P9 is controlled by the voltage provided at the collector of the transistor Q1 and the sine wave voltage appearing between the points P7 and P5 at the secondary winding $Ws2$ of the transformer TF2. Curve B of FIG. 3 shows the sine wave voltage appearing across the circuit points P7 and P5 of the secondary winding Ws2 of the transformer TF2.

In FIG. 1, a diode D4 is connected from anode to cathode between the circuit points P9 and P7. The diode D4 will be reverse biased whenever the point P7 is more positive than the voltage at the circuit point P5 by about 2.25 volts; therefore, the transistor Q1 alone controls the gating of the controlled rectifier S1 under these conditions. When, however, the voltage at the point P7 drops below about 1.65 volts, the diode D4 will conduct and thereby clamp the circuit point P9 to the point P7 which will pull the point P9 below 2.25 volts, the required positive value to gate on the switch S1. The controlled rectifier S1 cannot under these conditions be gated on regardless of the voltage supplied at the collector of the transistor Q1 because an insufficient positive voltage will be applied to the gate electrode thereof under these conditions.

The diode D4 and the winding between the points P5 and P7 thereby act as an inhibitor circuit preventing gating outside of the range as determined by the voltage at the point P7, which permits the diode D4 to be conductive and clamp the point P9 thereto. If for example, the voltage between the points P5 and P7 is nominally taken to be 55 volts RMS at 60 cycles per second, the rate of change of voltage at 0° and 180° is approximately 1350 millivolts per degree. If 1.65 volts at the point P7 will cause the diode D4 to become conductive, the 1.65 volts is equivalent to 1.2 degrees. The inhibitor circuit including the diode D4 and the winding between the points P5 and P7 therefore will prohibit gating outside the range of $\alpha=1.2°$ to $\alpha=178.8°$. The inhibiting of gating between these ranges is essential to insure the proper functioning of the circuit at the proper time intervals.

Curve B of FIG. 3 shows the 1.2 degree set off from zero and 180° wherein gating on of the controlled rectifier S1 is prohibited.

To insure that the proper gating conditions exist at the controlled rectifier S1, a time delay circuit including the resistor R5 and the capacitor C3 is utilized to delay the buildup of positive anode voltage on the controlled rectifier S1 and the charging current to the capacitor C2 until a predetermined time after the point P6 of the transformer TF2 becomes positive. This is accomplished through the use of a time delay circuit including the resistor R5 and C3 connected between the circuit points P6 and P5, which introduces approximately an 18½° phase shift between the circuit points P6 and P5 of the secondary winding Ws2. Thus, the charging current through the capacitor C2 does not begin to buildup until approximately 18½° after the point P6 becomes positive.

Figure 5:
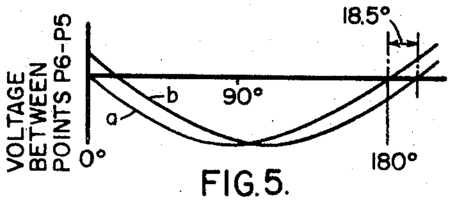
FIG. 5 is a plot used to explain the operation of the time delay circuit as utilized herein.

FIG. 5 shows the effect of the phase delay introduced by the time delay circuit including the resistor R5 and the capacitor C3. Curve *a* shows the voltage appearing across the terminals P6 and P5 of the transformer TF2 before the time delay is introduced. Curve *b* shows curve *a* delayed by 18½° due to the time delay circuit. The effect of the time delay can be seen at the point 180°, for example, when the curve *a* starts positive, which would ordinarily be the beginning of the charging cycle for the capacitor C2, the curve *b* is still negative and will remain negative until 18½° later. This will insure that the gate electrode of the controlled rectifier S1 will have sufficient time to be rendered negative due to the operation of the transistor Q1 as explained above.

Through the use of the three gate pulse generator circuits GPG–1, GPG–2 and GPG–3 with their respective three-phase inputs as indicated on the drawing, gating pulses of the waveform as shown in FIG. 4 will be developed across the terminals T1 through T6 which will be accurately spaced at 60° intervals, that is, with six pulses per cycles of the input frequency being developed.

Figure 6:
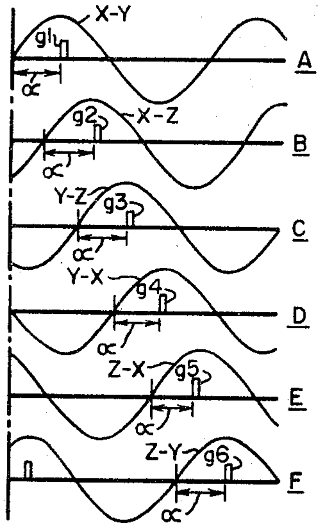
FIG. 6 is a waveform diagram used in the explanation of the generation of the gating pulses herein and includes curves A through F.

This may be seen by reference to FIG. 6 wherein curves A through F are shown to indicate the generation of the six pulses per cycle spaced 60° apart for a given delay angle $\alpha$ from the beginning of the X–Y phase. The delay angle $\alpha$ is selected to be 90° in the example shown. Thus, as shown in curve A, after a time delay $\alpha$, a gating pulse *g*1 will be generated across terminals T2 of GPG–1. Across terminals T5 of GPG–3 a pulse *g*2 will appear 60° after the pulse *g*1 developed across the terminals T1. It should be noted that the pulse *g*2 will be delayed by a delay angle $\alpha$ from the beginning of the X–Z phase cycle as shown in curve B of FIG. 6. As shown in curve C, after a time delay $\alpha$ from the beginning of the Y–Z phase cycle, a gating pulse *g*3, will appear at the terminals T4 of GPG–2, with this pulse being developed 60° after the gating pulse *g*2 developed at the terminals T5 shown in curve B.

A gating pulse *g*4 will be developed across the terminals T1 of the GPG–1 60° delay later than the pulse *g*3 developed across the terminals T4 as shown in curve D. The pulse *g*4 will be 180° out of phase with the pulse *g*1 developed at the terminals T2 as shown in curve A. The pulse *g*4 appears after a time delay $\alpha$ from the beginning of the Y–X phase. After a time delay of 60° from pulse *g*4 a pulse *g*5 will be generated across the terminals T6 of the GPG–3, which will appear after a time delay $\alpha$ from the beginning of the Z–X phase of the input voltage. The pulse *g*5 developed at the terminals T6 will be 180° out of phase of the pulse *g*2 developed across the terminals T5 of the GPG–3. After a time delay of 60° from the pulse *g*5 developed at the terminals T6, a pulse *g*6 will be developed at the terminals T3 of the GPG–2, as shown in curve F, which will be 180° out of phase for the pulse *g*3 developed at the terminals T4 as shown in curve C. The pulse *g*6 will occur at a time delay $\alpha$ from the beginning of the Z–Y phase.

It can thus be seen that the use of the three gate pulse generators GPG–1, GPG–2, and GPG–3 will provide a generation of six accurately spaced pulses 60° apart in time which may be utilized as gating pulses for a gate pulse amplifier, which may in turn provide gating pulses to control a high power controlled rectifier converter circuit such as shown in the above cited patent. It should also be noted that the delay angle $\alpha$ can be accurately controlled through the selection of the control voltage V*c*.

Although the present invention has been described with a certain degree of particularly, it should be understood that the present disclosure has been made only by way of example and that numerous changes and the details of construction and the combination and arrangement of parts and components can be resorted to without departing from the spirit and scope of the present invention.

We claim as our invention:

1. In a gate pulse generator circuit operative with control signals and first and second alternating signals having a predetermined phase relationship therebetween comprising the combination of:

circuit means for receiving said control signals and said first alternating signals and providing an output in response to a predetermined relationship being established therebetween;

controlled switching means operatively connected to and responsive to the output of said circuit means;

output means including a pulse transformer which is saturable operatively connected to said controlled switching means;

capacitive means operatively connected to said controlled switching means and said output means;

means for applying said second alternating signals to said capacitance means for the charging thereof during predetermined portions of the cycle of said second alternating signals;

said controlled switching means being responsive to the output of said circuit means to be rendered conductive to discharge said capacitive means and provide a gating pulse at said output means, said pulse transformer saturating after a predetermined time to determine the pulse duration of said gating pulse, said gating pulse being provided after a predetermined time delay with respect to said first alternating signals as determined by said control signals, a cosine relationship is established between said time delay and said control signals.

2. The combination of claim 1 further including:
a mirror image circuit of said gate pulse generator circuit so that a gating pulse is provided thereby 180° out of phase with the said gating pulse.

3. The combination of claim 2 including:
a polyphase voltage source for supplying a plurality of alternating signals including said first and second alternating signals, and including a plurality of gate pulse generator circuits equal in number to the number of phases of the polyphase source and being so arranged and connected that a predetermined number, in relation to the polyphase number, of said gating pulses will be provided per cycle of said polyphase voltage source.

4. The combination of claim 3 wherein:
a selected phase of said polyphase voltage is received by said circuit means of each of said gate pulse generator circuits with the output thereof being responsive thereto and to said control voltage,
another selected phase of said polyphase voltage being applied to said capacitive means of the respective gate pulse generator circuit so that said delay time may be controlled by said control signals in relation to the selected phases.

5. The combination of claim 1 further including:
said controlled switching means comprising a controlled rectifier device having a gate electrode,
an inhibitor circuit operatively connected to the gate electrode of said controlled rectifier device,
said inhibitor circuit being operative to clamp said gate electrode at a predetermined voltage during given portions of the cycle of said second alternating signals so that the conductivity of said controlled rectifier device will be prevented independently of the output of said circuit means.

6. The combination of claim 5 further including:
a time delay circuit operatively connected to said controlled rectifier device to delay the application of anode voltage thereto until after a sufficient time has elapsed to permit said device to have become non-conductive.

References Cited

UNITED STATES PATENTS 3,244,938 4/1966 Schatz ---------- 307—252 XR

ARTHUS GAUSS, *Primary Examiner.*

JOHN ZAZWORSKY, *Assistant Examiner.*

U.S. Cl. X.R.

307—252, 268, 262, 265; 328—67